United States Patent
Beck

(10) Patent No.: US 8,764,906 B2
(45) Date of Patent: *Jul. 1, 2014

(54) PARTICLE REMOVAL METHOD USING AN AQUEOUS POLYPHOSPHATE SOLUTION

(71) Applicant: Fontana Technology, Campbell, CA (US)

(72) Inventor: Mark Jonathan Beck, Los Gatos, CA (US)

(73) Assignee: Fontana Technology, Campbell, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/726,521

(22) Filed: Dec. 24, 2012

(65) Prior Publication Data

US 2013/0112228 A1    May 9, 2013

Related U.S. Application Data

(63) Continuation of application No. 13/316,540, filed on Dec. 11, 2011, now Pat. No. 8,337,624, and a continuation of application No. 12/069,205, filed on Feb. 7, 2008, now Pat. No. 8,075,697.

(60) Provisional application No. 60/888,859, filed on Feb. 8, 2007.

(51) Int. Cl.
*C23G 1/00* (2006.01)
*C11D 7/00* (2006.01)
*B08B 3/00* (2006.01)

(52) U.S. Cl.
USPC .................................. 134/2; 134/26; 510/175

(58) Field of Classification Search
None
See application file for complete search history.

(56) References Cited

U.S. PATENT DOCUMENTS

| 5,827,114 A * | 10/1998 | Yam et al. ................ 451/75 |
| 5,927,308 A * | 7/1999 | Kim ....................... 134/172 |
| 6,264,404 B1 * | 7/2001 | Hessburg et al. ........ 406/108 |
| 7,674,695 B1 * | 3/2010 | Loxley .................... 438/510 |
| 8,075,697 B2 * | 12/2011 | Beck ........................... 134/2 |
| 8,337,624 B2 * | 12/2012 | Beck ........................... 134/2 |
| 2005/0245422 A1 * | 11/2005 | Yamada et al. ........... 510/417 |
| 2006/0035797 A1 | 2/2006 | Tomita et al. |

OTHER PUBLICATIONS

The Aqueous Cleaning Handbook, 3rd Ed., 2002, p. 23.*
Kishimoto Sangyo Co Ltd, Resist Residue Remover and Cleaner, Patent Abstracts of Japan, Japanese Patent Application, Kokai Publication No. 2003-316028, publication date Nov. 6, 2003.

* cited by examiner

*Primary Examiner* — Nicole Blan
(74) *Attorney, Agent, or Firm* — Donald J. Pagel

(57) ABSTRACT

A method and cleaning solution for cleaning electronic substrates, such as a semiconductor wafers, hard disks, photomasks or imprint molds. The method comprises the steps of contacting a surface of the substrate with a cleaning solution comprised of a polyphosphate, and then removing the cleaning solution from the surface. Additional optional steps include applying acoustic energy to the cleaning solution while the cleaning solution is in contact with the surface, and removing the cleaning solution from the surface by rinsing the surface with a rinsing solution with or without the application of acoustic energy. The cleaning solution comprises a polyphosphate, such as any of the water soluble polyphosphates. Depending on the application, the cleaning solution may also comprise a base and/or a quantity of suspended particles. Complexing agents, amines, biocides, surfactants and/or other substances, may also be added to the cleaning solution.

19 Claims, 4 Drawing Sheets

PARTICLE REMOVAL METHOD USING AN AQUEOUS POLYPHOSPHATE SOLUTION

This application is a continuation of patent application Ser. No. 13/316,540, filed on Dec. 11, 2011, which was a continuation of patent application Ser. No. 12/069,205, now U.S. Pat. No. 8,075,697, both of which are incorporated herein by reference.

BACKGROUND OF THE INVENTION

As presently practiced, particle removal is usually achieved by a combination of mechanical and chemical mechanisms. There are six main mechanical ways to remove particles from a substrate: (1) brush scrubbing; (2) megasonic or ultrasonic vibration while immersed in or covered with a liquid; (3) high pressure water, or in general, a liquid jet; (4) aerosol (accelerated liquid droplets in a gas environment) jet bombardment; (5) polishing or buffing; and (6) ice blasting or ice bombardment, or more generally solid particle or solid pellet bombardment.

In many wafer or hard disk fabs, special dedicated tools are used to scrub or remove particles, often called scrubbers. In many such scrubbers one or a combination of the above six mechanical particle removal methods is used simply with room temperature or sometimes-heated DI (deionized) water. Sometimes chemicals can be added to enhance the removal efficiency. Usually one or several of these six mechanical ways to remove particles is also used in a so-called cleaning tool. Cleaning tools differ from scrubbers in that usually one of these six mechanical ways to remove particles is combined with chemicals instead of simple DI water to remove particles both with a mechanical method and a chemical method combined and usually in a cleaning tool, other functions are also performed in addition to particle removal. For example, metallic impurities, organic impurities and even wet etching of $Si_3N_4$, $SiO_2$, poly-Si, Ni, Co, Ti, TiN or other layers, and wet stripping of photoresist can be performed in a cleaning tool.

In a scrubber or cleaning tool for hard disks, a combination of ultrasonics, megasonics and brushes is usually used to clean the hard disk media. A variety of chemicals is added for removal of particles from such hard disks. In a cleaning tool for wafers, the most popular combination to remove particles is a combination of megasonic vibration together with a liquid mixture of $NH_4OH$, $H_2O_2$ and $H_2O$ in which the wafers are immersed or with which the wafers are covered. The megasonics systems commonly used in the semiconductor industry use frequencies close to or about 1 MHz (one megahertz).

Before the invention of megasonics, ultrasonics was used. Ultrasonics has frequencies in the range of 20 kHz to about 120 kHz. However, since the invention of megasonics, ultrasonics is rarely used on semiconductor substrates because of the damage potential at frequencies in the range of 20 kHz to about 120 kHz. Hence, megasonics with frequencies close to or about 1 MHz is the current state of the art for semiconductor substrates. In the hard disk industry a variety of frequencies are used ranging all the way from 40 kHz up to 1 MHz. Quite often in the hard disk industry a frequency of about 400 kHz is being used.

The most common system for particle removal, especially on semiconductor wafers, is a liquid mixture of $NH_4OH$, $H_2O_2$ and $H_2O$, used together with megasonics. This is a part of the so called RCA cleaning sequence originally developed by W. A. Kern and D. A. Puotinen, at the RCA company in 1965, and published in 1970, RCA Rev., 31, pp. 187-206 (1970). The traditional RCA cleaning sequence consists of 2 steps, the SC-1 step (Standard Clean-1 step) and the SC-2 step (Standard Clean-2 step). Specifically, the particle removal function of this RCA sequence is carried out by the SC-1 step of the RCA cleaning cycle. The SC-1 is also sometimes called the APM (Ammonia Peroxide Mixture) step. The SC-1 step (Standard Clean-1) is mainly aimed at removing particles while the SC-2 step (Standard Clean-2) is mainly aimed at removing metallic contamination. The SC-1 step consists originally of a 1/1/5 mixture of $NH_4OH$ (28% strength as $NH_3$-w)$H_2O_2$(31% strength as $H_2O_2$-w)/DI (deionized) water at 70° C. There have been many variations on this recipe both in terms of mixing ratios and in terms of temperature.

Because of the importance of this particle removal step in the semiconductor industry, there has been a lot of research on the mechanism of this particle removal step. This chemistry can even be used without a mechanical particle removal mechanism added. It is now widely accepted that, in case when there is no mechanical particle method added to the chemistry, and therefore, when particle removal is achieved by chemical contact only, then the contacting chemistry simply removes particles by underetching of the particle. A particularly good publication on this mechanism was written by Hiroyuki Kawahara, K. Yoneda, I. Murozono and T. Tokokoro, "Removal of Particles on Si Wafers in SC-1 Solution," IEICE Trans. Electron., Vol. E77-C, No. 3, March 1994, p. 492.

The underetching theory goes as follows: a controlled amount of the surface layer is uniformly removed or etched all over the surface of the substrate by the cleaning chemistry, usually on a wafer or a photomask or an imprint mold or a hard disk substrate. When etching this surface layer, the material underneath the particle is also etched away and this etching releases the particle from the surface. Then, the particle is washed away.

Since the current state of the art for removing particles by chemical means only relies on undercut etching, and since etching increases with temperature, everyone so far has found that particle removal efficiency increases with temperature. M. Meuris et al., Microcontamination, May 1992, p. 31, e.g. showed the effect of temperature on etching rate. Therefore, SC-1 solutions are usually used at elevated temperatures. Increased etching can also be achieved by using higher chemical concentration. If the etching is too excessive for the device or substrate at hand, then sometimes the temperature is lowered, but the particle removal efficiency is then reduced as well.

In the prior art, when SC-1 solutions are used without any mechanical particle removal method, the temperatures used always ranges from room temperature up to about 80° C. If there is no reliance on the chemical undercutting, and when relying on a mechanical method to remove particles instead, then the high temperature is not needed. For example, when using SC-1 together with megasonics to remove particles, the SC-1 or any alternative high pH chemistry, merely serves to prevent particles from redepositing. When using megasonics, the particles are removed by the megasonic vibration through the formation of cavitation events and are prevented from reattaching to the surface by the high pH of the SC-1 chemistry or alternative high pH chemistry.

Since megasonics relies on cavitation to remove particles and since cavitation is not very temperature dependent, but very dependent on the dissolved gases, it has been found that megasonics and SC-1 combined don't remove any particles when there are no gases present. It is possible to create cavitation without any dissolved gases present, so called vacuum cavitation, but this is only possible at very high power levels. Hence, at normal power levels, typically 10-100 W, there is no gaseous cavitation when there are no dissolved gases present and hence there is virtually no particle removal efficiency when using megasonics without any gases dissolved. In R. Gouk, J. Blocking, S. Verhaverbeke, "Effects of Cavitation and Dissolved Gas Content on Particle Removal in Single Wafer Wet Processing", in Proceedings of Semiconductor Pure Water and Chemicals Conference (SPWCC) 2004, Santa Clara, Calif., 2004, it is shown that at 925 kHz, and for power levels up to 0.15 W/cm$^2$ (corresponding to 100 W on a 300 mm wafer), there is absolutely no particle removal efficiency for dissolved gas levels of 30 ppb $O_2$. Only for power levels starting at 0.3 W/cm$^2$ (200 W), the particle removal efficiency starts to become non-zero (20%). However, even at only 100 W and with 300 ppb of dissolved gas ($O_2$ in this case), the particle removal efficiency is 90%. This shows clearly the effect of dissolved gas on the particle removal efficiency due to the cavitation of dissolved gas bubbles.

Currently, a cleaning paradox has emerged. Megasonic vibration works well for removing particles and with a very wide temperature range, but the cavitation which the megasonies produces, and which is used to remove particles, also damages the fine patterns on the wafers, photomasks and imprint molds and even advanced hard disks are starting to use patterned surfaces. Indeed, the patterns on the wafer, photomask, imprint mold and hard disks in advanced technologies of semiconductor manufacturing and hard disk manufacturing are becoming so small that they are very fragile and are very prone to mechanical damage. This started to be a problem when the pattern size on the wafers decreased to a size smaller than 0.3 micrometers in width or at least in one dimension. Initially this problem was addressed by lowering the megasonics power, but now with pattern sizes sometimes as small as 22 nm in one dimension, any megasonic power or rather any cavitation will destroy such patterns.

Therefore, a new method for removing small particles from the front side of the wafer without damaging the fragile structures is necessary. The underetching mechanism, which does not damage the fragile structures, however can also not be used anymore, since the devices are so small that underetching would remove valuable material from the surface of the device and hence the device characteristics would be degraded. This is the current cleaning paradox that we are faced with.

This is the case, because the current generations of small devices have the active device region extremely close to the top surface. This is very clearly shown for the case of semiconductor wafers and devices made on such wafers, in the publication by F. Arnaud, H. Bernard, A. Beverina, E. El-Frahane, B. Duriez, K. Barla and D. Le "Advanced Surface Cleaning Strategy for 65 nm CMOS device Performance Enhancement", Solid State Phenomena Vols. 103-104 (April 2005) pp. 37-40. In this publication, F. Arnaud et al. clearly show that reducing the underetching enhances the transistor characteristics. Hence the paradox when cleaning small patterns: mechanical particle removal cannot be used anymore for small particle removal, since it also damages the fine patterns, and conventional chemical particle removal by underetching cannot be used anymore, because of loss of surface material which is now a substantial part of the device.

Even in those cases where the substrate is completely flat and where damage is not a paramount concern, it has been found that for very small particles, the mechanical methods are not effective anymore. Mechanical methods to remove particles, such as, but not limited to, brush scrubbing, spray aerosol bombardment, and ultrasonic and megasonic vibration, are very effective for the large particles, but loose efficiency for the very small particles. Hence, there is a need for an improved chemical method to remove these very small particles even on substrates without patterns. This is true for hard disks and for wafers after CMP (chemical mechanical polishing).

Another technique that has been known for a long time to remove contamination from substrates is polishing or buffing. This technique is generally used to remove gross contamination including entirely adhered layers of material from generally flat surfaces in a wide variety of industries. In the semiconductor and the hard disk industry, polishing and cleaning with particle containing slurries is used extensively on flat surfaces and has been known for a long time. This is generally carried out with a hard particle containing chemical or slurry. A particularly popular particle source is silica, as is shown in U.S. Pat. No. 4,050,954. Even though such silica containing chemicals have been used for polishing semiconductor substrates since at least the early 1970's, it was only until the 1990's that the use of such silica containing chemicals specifically for cleaning has become known. One of the prior art reports of using silica particulate containing chemicals for cleaning semiconductor wafers is U.S. Pat. No. 5,846,335.

As a summary, the prior art in cleaning does not provide for a method to remove particles, including tenaciously adhered particles, very effectively from a surface with fragile structures exposed, without damaging the fragile structures. There is a great need in the semiconductor industry and the hard disk industry for a cleaning solution and a method that can remove small particles from the front side or back side of semiconductor wafers, photomasks and imprint molds and hard disks, without damaging the fine patterns and without substantial underetching of the surface material. In the prior art, particle removal is achieved by a combination of mechanical forces, undercut etching and benign particle lift (e.g. simple room temperature DI water rinsing). What is needed is an efficient particle removal method that can remove the particles without mechanical forces and without undercut etching. This benign particle lift is necessary when dealing with very small particles and fragile patterns on wafers, photomasks and imprint molds and hard disks.

BRIEF SUMMARY OF THE INVENTION

Briefly, the present invention is a method and cleaning solution for cleaning an electronic substrate, such as a semiconductor wafer, a hard disk, a photomask or an imprint mold. The method comprises the steps of contacting a surface of the substrate with a cleaning solution comprised of a polyphosphate; and then removing the cleaning solution from the surface. Additional optional steps in the method include applying acoustic energy to the cleaning solution while the cleaning solution is in contact with the surface, and removing the cleaning solution from the surface by rinsing the surface with a rinsing solution with or without the application of acoustic energy to the rinsing solution.

The cleaning solution comprises a polyphosphate, such as any of the water soluble polyphosphates. Tripolyphosphates with cations such as $H^+$, $Na^+$, $K^+$, $NH_4^+$ or $R_3NH^+$ are particularly useful in the present invention. Depending on the application, the cleaning solution may also comprise a base, such as KOH, $NH_4OH$, TMAH or choline, and/or a quantity of suspended particles, such as colloidal silica, ceria and alumina. Complexing agents, amines, biocides, surfactants and/or other substances, may also be added to the cleaning solution.

DETAILED DESCRIPTION OF THE INVENTION

Figure 1:
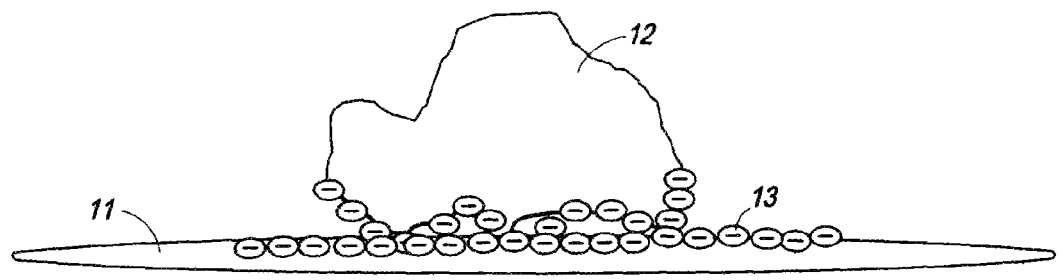
FIG. 1 is a schematic side view of a particle on a wafer.

According to the present invention, small particles are removed from an electronic substrate such as a wafer or a hard disk or a substrate used to manufacture such wafers or hard disks, such as a photomask or an imprint mold, by simply contacting such substrates with a solution containing a polyphosphate. This particle removal (or cleaning) can be accomplished even in the absence of mechanical forces to remove particles. Of course, an additional mechanical force may be added to the cleaning method, such as, but not limited to, ultrasonic or megasonic vibration, aerosol spray bombardment, brush scrubbing or polyurethane cloth buffing.

Polyphosphates that can be used in the present invention include any water soluble polyphosphate. For example, linear polyphosphates having the following formula are acceptable for use in the present invention:

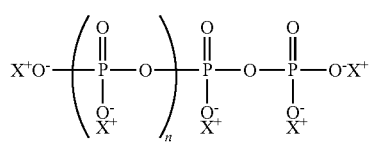

Where n=0, 1, 2, 3, . . . 1000 and $X^+=H^+$, $Na^+$, $K^+$, $NH_4^+$, $R_3NH^+$ and $NR_4^+$. $X^+$ can be a combination of these cations or it can be a single cation chosen from this list repeated on each location of the polyphosphate where $X^+$ is annotated.

Specific examples linear polyphosphates include sodium tripolyphosphate (n=1, $X^+=Na^+$), potassium tripolyphosphate (n=1, $X^+=K^+$), ammonium tripolyphosphate (n=1, $X^+=NH_4^+$), triethanolamine tripolyphosphate (n=1, $X^+$=triethanolamine cation), choline tripolyphosphate (n=1, $X^+$=choline cation), tTetra Methyl Ammonium (TMA) tripolyphosphate (n=1, $X^+=TMA^+$), tetra-sodium, -potassium or -ammonium pyrophosphate (n=0, $X^+=Na^+$ or $K^+$ or $NH_4^+$), disodium dihydrogen pyrophosphate (n=0, $X^+=Na^+$ and $H^+$), di-ammonium dihydrogen pyrophosphate (n=0, $X^+=NH_4^+$ and $H^+$) and ammonium polyphosphate (n=1-60, $X^+=NH_4^+$). Penta-ammonium tripolyphosphate is preferred due to the absence of an alkali metal such as Na or K. When potassium (K) can be used, the K-tripolyphosphate is preferred. The K-tripolyphosphate structure is as follows:

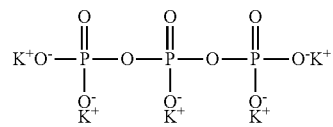

Other water soluble polyphosphates can also be used, such as e.g. sodium, potassium or ammonium polymetaphosphate. Sodium hexametaphosphate is a typical example of the polymetaphosphates. The structure of the trimetaphosphoric acid is as follows:

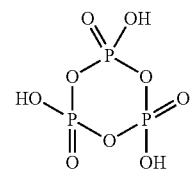 [SMILES: O=P1(O)OP(=O)(O)OP(=O)(O)O1]

Preferably a tri-polyphosphate may be used. Typically either Na-tripolyphosphate or K-tripolyphosphate is used or a penta ammonium tripolyphosphate may be used. Other tripolyphosphates can be used as well, such as, but not limited to triethanolamine tripolyphoshate or the tripolyphosphoric acid may be used. The tripolyphosphate in the concentrated source solution is typically between 0.5% and 200%-w and preferably between 2% and 150%-w and most preferably between 5% and 100%-w as a ratio by weight of polyphosphate to added liquid. The maximum concentration is typically determined by the solubility limit of the tripolyphosphate. The solubility of the K-tripolyphosphate is much higher than the solubility of the Na-tripolyphosphate. E.g. the Na-tripolyphosphate solubility is only about 20%-w. The K-tripolyphosphate on the other hand is much more soluble and can be dissolved even up to about 150%-w concentrations. The penta ammonium tripolyphosphate is also very soluble, but is not so widely available. After dilution of the source solution at point-of-use, the final concentration of tripolyphosphate for cleaning the substrates is preferably 0.2%45%.

The tripolyphosphate, and preferably either the K-tripolyphosphate or the penta ammonium tripolyphsophate, can also be used as a replacement for the $NH_4OH$ in the ubiquitous SC1 solution.

The K- or penta ammonium tripolyphosphate with or without peroxide added is a superior cleaning solution to the conventional ammonium hydroxide ($NH_4OH$) and hydrogen peroxide ($H_2O_2$) solution. The tripolyphosphate and preferably the K- or the penta ammonium tripolyphosphate can be used by itself, it can be used combined and it can also be combined with potassium or ammonium hydroxide. Potassium or ammonium hydroxide is typically added to increase the pH of the solution. Surfactants and chelating agents can also be added. Finally, in order to make up a cleaning solution, $H_2O_2$ can be added to make an analogue of to the omnipresent SC-1 solution. The adding of $H_2O_2$ is useful to avoid any Si surface etching. The tripolyphosphate in a concentrated source solution is typically between 0.5% and 200% and preferably between 2% and 150% and most preferably between 5% and 100%. When ammonium hydroxide is added to the concentrated source solution, it can be added in a concentration range of 1%-28%-w (weight of $NH_3$) to make a source solution consisting of ammonium hydroxide and ammonium polyphosphate. Potassium hydroxide can be added to the K-tripolyphosphate in the source solution in a range of 0.001%-45% (weight of KOH).

After dilution in the fab the final concentration of polyphosphate for cleaning the substrates is preferably 0.2%45%. Typically the source solution will be diluted between 5 and 50 times with DI water in the fab to make up the substrate cleaning solution, preferably 7 to 25 times, and most preferably 9 to 15 times.

The source solution may also contain from 0.01% to 20% of an organic amine. Suitable organic amine compounds may be selected from alkanolamines (e.g. primary alkanolamines: monoethanolamine, monoisopropanolamine, diethylethanolamine, ethyl diethanolamine, secondary alkanolamines: diethanolamine, diisopropanolamine, 2-(methylamineo) ehtano, morpholine, ternary alkanolamines: triethanolamine, tri-isopropylamine), alkylamines (e.g. primary alkylamines, monomethylamine, monoethylamine, monopropylamine, monobutylamine, monopentylamine, cyclohexylamine, secondary alkylamines: dimethylamine), alkyleneamines (e.g. primary alkylene amines: ehtylenediamine, propylenediamine, triethylenetetramine), and mixtures thereof. Preferred examples of such materials include monoethanolamine, ethylenediamine, triethylenetetramine and mixtures thereof. The most preferred is monoethanolamine. The amount of the organic amine preferably ranges from 0.01% to 20%, and most preferably from 0.2% to 2%.

The source solution may also contain a biocide such as 2-Methyl-4-isothiazolin-3-one (MIT) or 2-Methyl-4-Isothiazolin-3-one Hydrochloric acid (C4H4NOS, HCl), (MIHCA). The concentration of the biocide is preferably from 1 ppm to 100 ppm, and most preferably form 30-70 ppm. Other biocides may be used as well.

Surfactants can also be added. Typically non-ionic surfactants are preferred. Preferred surfactants are the ethylene oxide type surfactants with a general structure $C_nH_{2n+1}O(C_2H_4O)_mH$. Ideally the number of carbon atoms in the hydrocarbon chain n is 1.5 or less times the number of oxyethylene groups m. Ideally, the number of carbon atoms n is more than 0.5 of the number of oxyethylene groups in. A good non-ionic surfactant is $C_{12}H_{25}O(C_2H_4O)_{11}H$. The concentration of the surfactant in the concentrated solution will be between 0.1% and 5%. Preferred concentrations are around 0.5% for the concentrated source solution. The concentration after dilution with water and when used for cleaning the surfaces will be preferably between 0.0001 to 0.5% by weight. This is between 1 ppm and 5000 ppm by weight. More preferably the concentration after dilution will be between 10 ppm and 500 ppm.

Sequestering agents or complexing agents can also be added. Preferred sequestering or complexing or chelating agents are the nitrogen-containing carboxylic acids such as ethylenediaminetetraacetic acid (EDTA) and diethylenetriaminepentaacetic acid (DTPA). Especially preferred from the standpoint of the cleaning effect is ethylenediamindi-o-hydroxyphenylacetic acid (EDDHA). The concentration of the sequestering agent in the concentrated solution will be between 0.1% and 5%. Preferred concentrations are around 0.5%. The concentration of the sequestering agent after dilution with water and when used for cleaning the surfaces will be preferably between 10 ppm and 500 ppm.

For the clarity of this invention, in the remainder of this invention, we will mostly talk about tripolyphosphate, even though other suitable water-soluble polyphosphates can be used as explained earlier. The ammonium polyphosphate is preferred, when no alkali metals are allowed in the cleaning solution, but for the clarity of this invention, in the remainder of this invention, we will mostly talk about the tripolyphosphate. If alkali metals are allowed, the K-tripolyphosphate is preferred. The K in the solution can be rinsed off the surface very effectively, since it does not bind with the surface of the wafer or photomask and is extremely soluble in DI water.

Alternatively to the polyphosphate of this invention or together with the polyphosphate of this invention, small particles can be removed from the front side by contacting the front side of such substrates with a solution containing other particles, even in the absence of mechanical forces to remove particles. While this may seem simple, it is against conventional wisdom in cleaning and is totally unexpected. Even though previous authors have noted that adding particles to a cleaning solution can help with cleaning, all previous authors have used such a cleaning solution in conjunction with mechanical agitation methods, which are known by themselves to remove particles. On top of that, all previous authors or inventors have used such a cleaning solution only on planar substrates, i.e. wafers without structures or alternatively said completely flat surfaced wafers. In this invention, it was found that contacting a semiconductor surface with a solution containing added scrubbing particles can remove a substantial amount of the particles adhered on the surface of the substrate, such as a wafer, photomask or imprint mold, containing fragile structures, even without any mechanical agitation, and most importantly without damage to such fragile structures and finally also without depositing these scrubbing particles on the substrates. Without being bound by theory, it is believed that this surprising effect is due to repulsion between the particles in the solution and the particles on the surface of the wafer (or other substrate). One of the solutions according to this invention, used for cleaning the fragile structures, contains suspended scrubbing particles, which are added on purpose. The most preferred suspended scrubbing particles are silica particles. Silica particles have long been used in polishing slurries and are readily available in different diameters.

One of the preferred point-of-use cleaning solutions is a suspension of colloidal silica particles in dilute ammonia and a polyphosphate. This point-of-use cleaning solution is preferably made by dilution of a concentrated source solution with water in the fab where the substrates will be cleaned. The source solution is preferably a concentrated solution that is manufactured off-site and is shipped to the fab where it is finally diluted with water. The concentrated source solution consists according to the present invention preferably of $NH_4OH$ in a concentration between 1 and 28%-w (as $NH_3$) and colloidal silica in a concentration preferably between 0.001 and 40%. More preferably the concentrated source solution ranges in $NH_4OH$ between 5 and 28%-w (as $NH_3$) and the colloidal silica is in a concentration range between 0.01 and 40%-w. The colloidal silica size is preferably in a range from 7 nm to 500 nm and more preferably in a range from 12 nm to 100 nm. Typically such a concentrated solution will be diluted with water in the fab before use with a factor of 1:5 to 1:200. More preferably it will be diluted with a factor 1:8 to 1:100 and most preferably between 1:10 to 1:20. At point-of-use also $H_2O_2$ can be added to make the analogue to the ubiquitous SC-1 solution.

When used with the silica particles, the concentrations for the tripolyphosate are similar to the concentrations of the tripolyphosphate used without colloidal silica particles present. This would then be a solution containing the tripolyphosphate together with the colloidal silica particles.

The solution with suspended silica particles or the solution with water-soluble phosphates or the solution with both suspended silica particles and with water-soluble phosphates with or without amines, surfactants and or sequestering agents added preferably can be contacted on the substrate of the wafer, hard disk, photomask or imprint mold in a bath or immersion type apparatus, which can be single wafer or batch, or in a spinning wafer type apparatus, which can also be single wafer or batch or in a horizontal proximity cleaner such as disclosed in U.S. Pat. Nos. 6,616,772 B2, 7,000,622 B2 and 7,045,018 B2 or in any other apparatus type suitable for contacting one or more wafers with a solution with suspended colloidal silica particles and/or water-soluble phosphates with or without $NH_4OH$ or KOH or other chemicals added and with or without amines, surfactants and or sequestering agents added.

Finally, it is clear that other substances may be added to the solution with suspended colloidal silica and/or water-soluble phosphates with or without $NH_4OH$ or KOH. Adding other substances to this solution does not constitute a deviation from the idea of the current invention. Specifically $H_2O_2$ may be added to the solution.

It is also clear that other suspended particles in the place of colloidal silica particles or in addition to colloidal silica particles can be used. Examples of other suitable suspended particles are ceria (i.e. $CeO_2$) containing particles, and alumina (i.e. $Al_2O_3$) containing particles. However, for the clarity of this invention, in the remainder of this invention, we will mostly talk about suspended colloidal silica particles, even though other suitable suspended particles can also be used.

The removal efficiency of more tenaciously adhered particles on the surface can be improved from the simple contacting with a particle containing solution of this invention or a polyphosphate containing solution of this invention in several ways outlined further in this invention.

Such known techniques are e.g. megasonics, an aerosol spray, a scrubbing action with a PVA brush and a buffing with a polyurethane cloth. Indeed, the megasonics act by causing cavitation events due to the dissolved gases in the solution. These cavitation events cause a mechanical agitation on the adhered particles and hence dislodge them from the surface of the wafer. The megasonics also act by reducing the boundary layer and hence by bringing the suspended silica particles closer to the surface of the wafer and hence closer to the adhered particles that need to be removed. An aerosol spray technique exerts a mechanical force onto adhered particles by causing a very fast flow of liquid over the surface of the wafer. An aerosol spray technique can be set up such that it only exerts a force on large particles and large features. Hence, an aerosol spray technique can be selective for exerting a force on large particles and large features, but not on small particles and small features, which are very fragile. An aerosol spray technique also reduces the boundary layer and hence works in tandem with the suspended silica particles in a similar way like the megasonics.

In addition, after the cleaning is finished, it is advantageous to follow up the cleaning sequence with an improved DI (deionized) water rinse. The improved DI water rinse can consist of using megasonic energy without gas to avoid cavitation or megasonic energy at high frequency. The improved DI water rinse can also be a rinse with a spray. A spray rinse can be a regular water spray or an aerosol spray. A regular water spray is effective; preferably a flow in excess of 1 L/min per substrate is very effective.

The temperature can be any temperature from 0 degrees C. to 100 degrees c with room temperature preferred because of its ease and economical advantage. For absolute best particle performance lower temperatures are even preferred. Subambient temperatures between 1° C. and ambient temperature are the most preferred.

After cleaning with the polyphosphate and/or the silica particles and specifically after cleaning with a K-polyphosphate and/or a K-stabilized silica particle solution, it is desired to remove all of the potassium, all of the polyphosphate and all of the silica. Normally this can be done adequately by thorough rinsing. If absolutely the lowest levels of K and phosphate remaining are necessary, then a 2 stage cleaning with first a $NH_4OH$ based clean, such as a SC-1 or simply $NH_4OH$ based rinsing, followed by an HCl based cleaning, such as SC-2 or simply HCl rinse water can be used. Alternatively the $NH_4OH$ based step can be skipped and the rinsing can be acidified with HCl.

For purposes of illustration, the principles and methods of the present invention for a concentrated solution and a cleaning solution and a method and apparatus for cleaning the front side of the wafer, hard disk, photomask or imprint mold and the bevel of the wafer will now be described and examples will be given. In the remainder of this patent application, and for sake of simplicity, we will deal mostly with wafers, but it needs to be understood that other substrates such as hard disks and substrates used in the manufacturing of such wafers or hard disks such as photomasks and imprint molds with or without fragile features can also be cleaned with the method, apparatus and solution of the current invention.

Without being bound by theory, it is thought that the water-soluble phosphates interact with the adhered particles by putting an additional electrostatic charge on the particles and providing for an increased electrostatic repulsion force. This is illustrated in FIG. 1. In FIG. 1, a wafer 11 has an adhered particle 12 on its surface. The water-soluble phosphates put negative charges 13 on both the surface of the wafer and the surface of the particle. The repulsion between these negative charges means that the particle and the surface are repelled and hence the particle can be removed. Only the charges which are relevant for the removal of the particle are shown. The solution of this invention with water-soluble phosphates remove particles substantially better than the conventional ammonium hydroxide only solutions, such as the ubiquitous SC1 solution or other solutions known in the prior art for cleaning wafers or hard disks or photomasks or imprint molds.

Typical make-up solutions according to this invention will now be given in the following examples.

Example 1

Typical source polyphosphate solutions are made up off-site by mixing a polyphosphate with DI-water to a high concentration. A typical make-up of a simple concentrated solution according to the invention is shown in Table 1:

| Reagents | Amounts to make 1 L concentrated solution |
| --- | --- |
| K-tripolyphosphate (as solid powder) | 1000 g |
| Water | Balance to make up 1 L |

To this solution other substances can be added such as e.g. KOH, $NH_4OH$ and monoethanolamine. Addition of KOH is very useful to increase the pH further. This is useful when surface etching is less of a concern, such as in hard disk cleaning. This solution in concentrated form can be transported to the point of use. At the point of use, this solution can be diluted with DI water before use as a cleaning, solution. For example, the solution can be diluted in a ratio of 10:1 DI water:source solution of example 1. Cleaning can then be carried out by immersing the electronic substrate or substrates in this diluted solution or by spraying this diluted solution onto the electronic substrates. The 10:1 diluted solution of example 1 yields a pH of about 9.5. The 10:1 diluted solution of example 1 was compared against a $NH_4OH$ solution of the same pH for particle removal efficiency. At first $SiO_2$ particles were deposited on a set of silicon wafers. Then the particles were counted. One set of contaminated wafers were carefully immersed into a 10:1 diluted solution of example 1 and another set of identically contaminated wafers were carefully immersed into a $NH_4OH$ solution of the same temperature and pH. Care was taken as not to agitate the solution. Then, the wafers were spray rinsed, dried and particles were counted. The removal efficiency on average was 80% for the 10:1 diluted solution of example 1 versus only 28% for the $NH_4OH$ solution.

Example 2

Typical alkali free polyphosphate source solutions are made up off-site by mixing a polyphosphate with DI-water to a high concentration. A typical make-up of a simple concentrated solution according to the invention is shown in Table 2:

| Reagents | Amounts to make 1 L concentrated solution |
| --- | --- |
| Water soluble ammonium-polyphosphate, such as a tripolyphosphate, (as solid powder) | 500 g |
| Ammonium hydroxide solution dissolved in water in a concentration of 28% as $NH_3$ | Balance to make up 1 L |

To this solution other substances can be added such as monoethanolamine, surfactants, sequestering agents and biocides. This solution in concentrated form can be transported to the point of use. At the point of use, this solution can be diluted with DI water before use as a cleaning solution. E.g. the solution can be diluted in a ratio of 10:1 DI water:source solution of example 1 and by adding $H_2O_2$ in the same dilution ratio. Cleaning can then be carried out by immersing the electronic substrate or substrates in this diluted solution or by spraying this diluted solution onto the electronic substrates.

Example 3

A typical make-up of a concentrated solution according to the invention consisting of a combination of a polyphosphate and colloidal silica. Typical colloidal silica solutions that can be used are manufactured by Grace Davison. The colloidal silica solutions that are very useful for the current invention are the AS-30, AS-40 and SM-AS series, manufactured by Grace Davison. The AS-30 contains colloidal silica with a diameter of 12 nm, the AS-40 contains colloidal silica with a diameter of 22 nm and the SAM-AS contains colloidal silica with a diameter of 7 nm. A typical make-up of a simple concentrated solution according to the invention is shown in Table 3:

| Reagents | Amounts to make 1 L |
| --- | --- |
| ammonium polyphosphate, such as a tripolyphosphate | 400 g by weight |
| AS-40 Colloidal silica solution (22 nm colloidal silica, 40%-w) | 200 mL by volume |
| $NH_4OH$ solution (28%-w as $NH_3$) | Balance to make up 1 L solution |

This concentrated solution of example 3 can be made off-site and be transported to the fab. In the fab, it is typically diluted with water with a factor 110 to a final cleaning concentration of about 0.8% colloidal silica (22 nm), about 1.4% $NH_4OH$ (as $NH_3$) and ammonium polyphoshate about 4%. $H_2O_2$ can also be added. $H_2O_2$ would typically be added in the same or higher amount as $NH_4OH$.

Typically, pH ranges between 7 and 14 and preferably between 8 and 12 and most preferably between 9 and 11 are very good for cleaning particles in combination with the colloidal silica and/or the polyphosphate. Other substances can be used instead of $NH_4OH$ to get a similar pH. Typical other substances used to increase the pH are e.g. TMAH (tetramethylammonium hydroxide) and choline. In the case where there is no need for an alkali free solution, such as e.g. in the majority of hard disk cleaning operations, KOH is preferred. In the case when K-tripolyphosphate is being used, the K will cause a pH in the range of about 8 to 11 by itself, even without the addition of additional KOH, $NH_4OH$ or TMAH or choline.

The solution diluted at point-of-use can be cooled to sub-ambient temperatures before use. This improves the electrostatic repulsion even more and it also prevents the solution from etching the surface. This can be advantageous, since longer soaking or immersion in the cleaning solution improves the particle removal. However, long soaking or immersion may lead to surface etching. In order to prevent this, a subambient temperature reduces the etch rate of the surface at higher pH.

After particle cleaning, a thorough rinsing is required. A spray rinsing with high flow spray is preferred. Typical spray flows of 1 L/min to 4 L/min per substrate are preferred. A high flow without aerosol is preferred when fragile patterns are exposed. If no fragile patterns are exposed an aerosol atomized and accelerated spray can be used. After rinsing, an HCl or low pH cleaning is preferred to remove all of the potassium (K), when K is used and to remove all of the polyphosphate.

Figure 2:
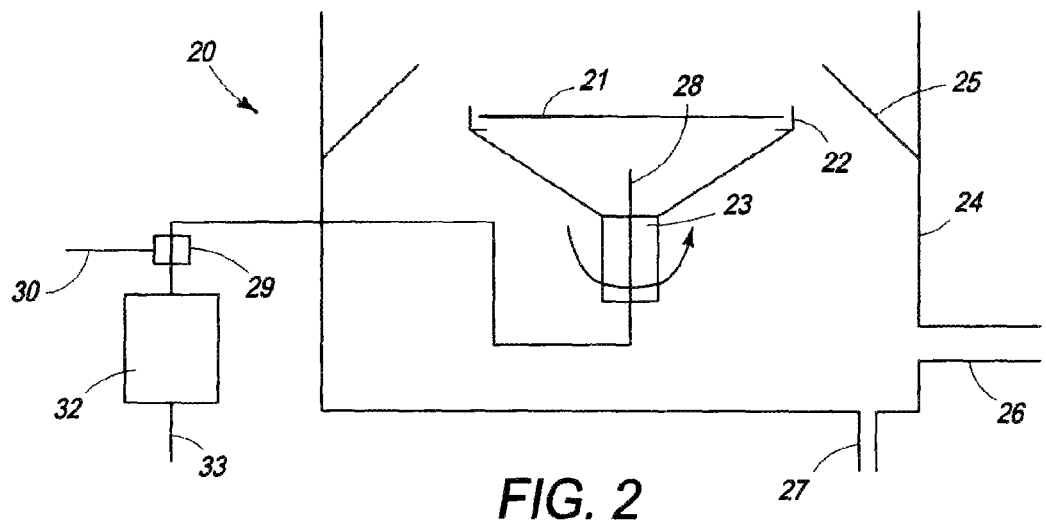
FIG. 2 is a schematic side view of a single wafer spin-spray cleaning chamber according to the present invention.

An example of a single wafer spin-spray cleaning chamber will now be given in more detail. Referring to FIG. 2, the spin chamber 20 contains the wafer 21, being held horizontally by a wafer holder 22, connected to a motor 23. The wafer 21 can be a semiconductor wafer or other electronic substrate, such as a photomask, an imprint mold and a hard disk. The motor and wafer holder assembly is mounted in a bowl 24 containing a liquid diverter 25, an exhaust 26 and a drain 27. A nozzle 28 is mounted to direct the liquid solution with suspended colloidal silica and/or polyphosphate, preferably at subambient temperature, onto the spinning wafer 21. The nozzle 28 is directed to dispense the liquid from below the wafer while the wafer is facing front-side down. The nozzle 28 is fed from a mixer 29 where a solution of suspended colloidal silica and $NH_4OH$ and/or polyphosphate and DI water is mixed in the desired ratio. The solution of suspended colloidal silica and $NH_4OH$ and/or polyphosphate is fed from line 30. A chiller 32 may cool the incoming DI water from line 33 down to a desired subambient temperature. In addition to the nozzle 28, which can supply subambient temperature liquid onto the spinning wafer, another nozzle (not shown) can be used to supply an accelerated atomized aerosol of suspended colloidal silica onto the wafer. This accelerated nozzle helps in bringing the colloidal silica in close proximity to the adhered particles on the wafer. A close up of such an accelerated atomized aerosol nozzle configuration is shown in FIG. 3.

Figure 3:
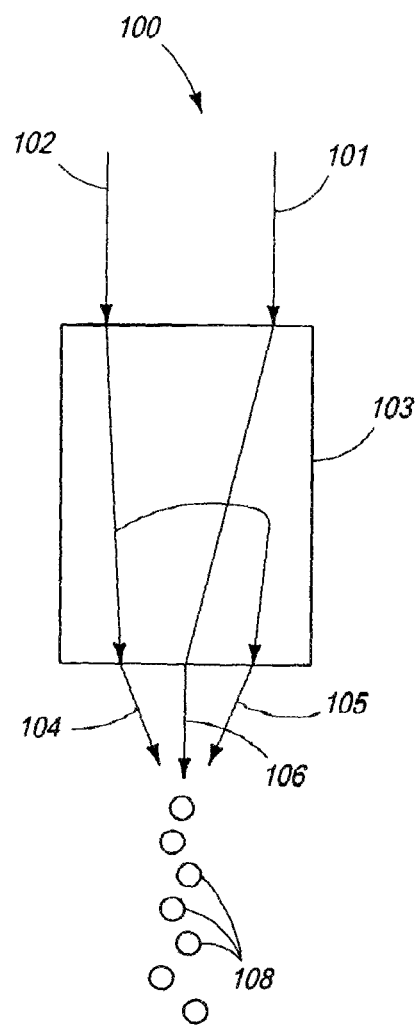
FIG. 3 is a schematic side view of an accelerated atomized aerosol nozzle according to the present invention.

Referring to FIG. 3, a nozzle 100 is shown with a nozzle body 103 and a liquid inlet 101 for the solution with colloidal silica and/or polyphosphate. An inlet 102 is the gas inlet. A variety of accelerating gases can be used, but most conveniently $N_2$ or CDA (compressed dry air) can be used. The liquid inlet 101 is connected to a liquid outlet 106. The gas inlet 102 is connected to gas outlets 104 and 105, which can be a single circular outlet. The gas coming out of outlets 104 and 105 atomizes and accelerates the atomized droplets 108 of the liquid coming out of outlet 106.

The atomized aerosol containing suspended colloidal silica and/or polyphosphate is jetted towards the wafer surface in order to bring the silica particles in close proximity to the adhered particles on the wafer. Care needs to be taken that the accelerated suspended silica does not damage the fragile structures. This can be done by controlling the acceleration velocity to a velocity below the damage threshold. Even though the chiller 32 in spin chamber 20 is positioned before the mixer 29, the mixing of suspended colloidal silica and $NH_4OH$ and and/or polyphosphate and DI water can be done before the chiller. Even though in FIG. 3, the atomized aerosol of suspended colloidal silica is supplied with a solution of suspended colloidal silica and/or polyphosphate, the aerosol can also be supplied with simple DI water. In this case the aerosol is merely used to create a motion in the solution already on the wafer or the aerosol jet is used to remove large particles selectively as is known in the prior art.

After the wafer contacting with a solution of suspended colloidal silica and/or polyphosphate with or without $NH_4OH$ added, the wafer can preferably be rinsed with subambient temperature DI water. Indeed, the rinsing of the wafer with subambient temperature DI water will reduce the final particle count. This is specifically important for such applications as photomasks and/or imprint molds. The drying can be done with any of the known methods for drying wafers, photomasks or imprint molds. In batch mode the most preferred drying method is the surface tension gradient method, preferably using a vapor of IPA (isopropyl alcohol). However, a spin dry method can also be used. In a single wafer mode a surface tension gradient drying method can be used or a simple spin dry method can be used. Any other method to dry a substrate without adding substantial contamination during the process of drying, i.e. any known clean drying method, can also be used. If a surface tension gradient drying method is used, a vapor of IPA can be blown in the center of the wafer, while the wafer is facing front-side down. This IPA nozzle is not shown in FIG. 2.

Figure 4:
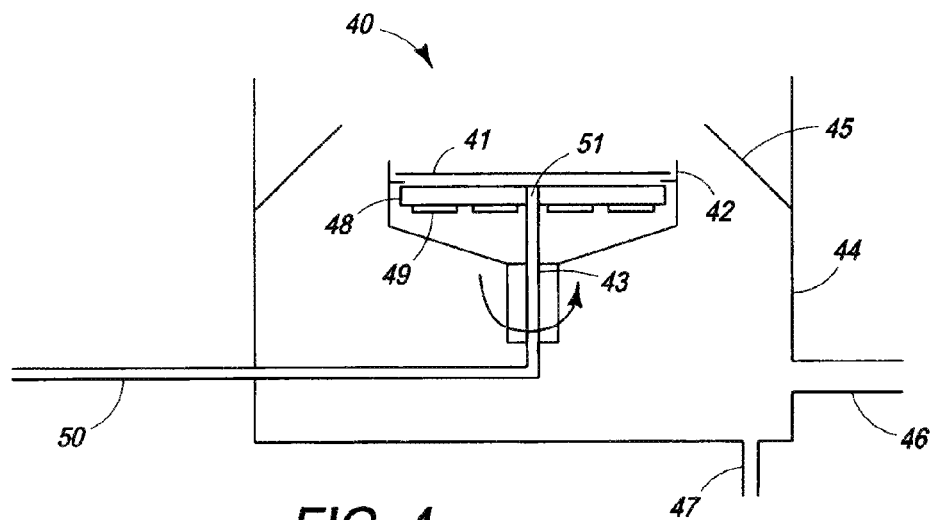
FIG. 4 is a schematic side view of a single wafer spin-spray tool according to the present invention.

Even though the simple contacting with a solution of suspended colloidal silica and/or polyphosphate can remove submicron particles very effectively, the removal efficiency can be improved as shown above by bringing the suspended colloidal silica in close proximity to the adhered particles on the wafer. This can be done with an accelerated jet, but it can also be done by the use of megasonics. One such apparatus, a single wafer spin-spray tool, is shown in FIG. 4. In the single wafer spin-spray apparatus 40 of FIG. 4, a wafer holder 42 connected to a motor 43 holds a wafer 41 (e.g. a semiconductor wafer or other electronic substrate, such as a photomask, an imprint mold and a hard disk). The wafer is held with the front side of the wafer facing down. Positioned below the wafer is a sonic (acoustic) transducer 48. The sonic transducer is, for example, made of stainless steel or aluminum and is preferably coated with PFA. On the backside of the sonic transducer, PZT crystals 49 are bonded to generate the sonic (acoustic) waves. The PZT crystals are connected to a megasonic frequency power supply (not shown) and protected in a housing to isolate the PZT crystals from the cleaning liquids (not shown). Closer to the center of the wafer, there is a liquid feed through 51, which is connected to a chemical feed line 50. This chemical feed line supplies chemicals or DI water through the sonic transducer 48 to the backside of the wafer 41 or photomask. The PZT crystals 49 generate the sonic waves in a frequency range of 200-6000 kHz. Conventionally frequency ranges between 700 kHz and 1.8 MHz are being used. This is commonly used for megasonic cleaning. However, any frequency range of 200-6000 kHz can be used.

Figure 5:
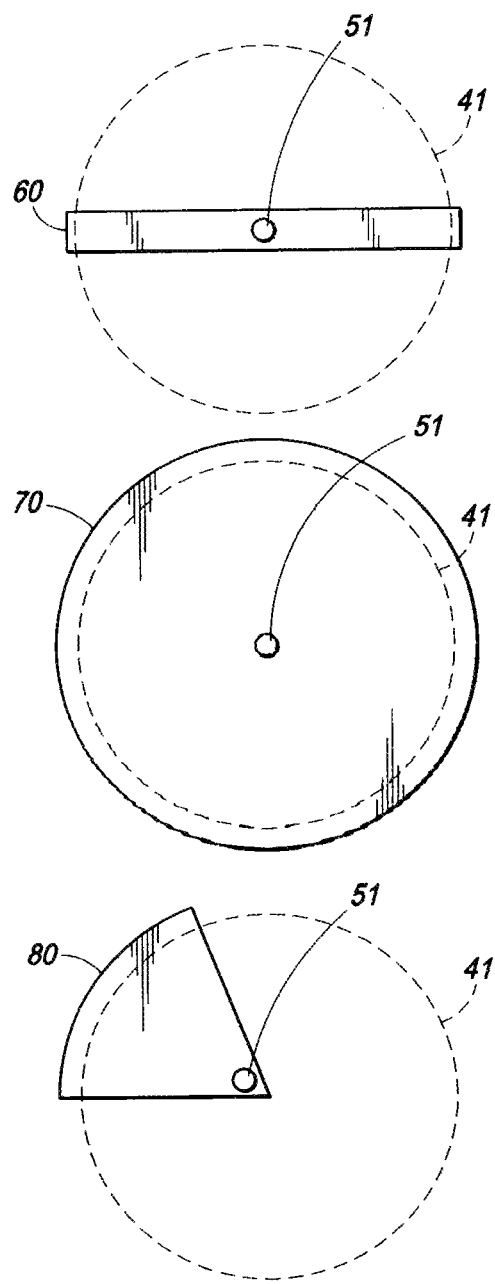
FIG. 5 is a schematic top view of several sonic (acoustic) transducers.

The wafer 41 with wafer holder 42, motor 43 and sonic transducer 48 is mounted inside a bowl 44 with liquid diverter 45, drain 47 and exhaust 46. The sonic transducer 48 can have various shapes as is shown in FIG. 5. In FIG. 5, a linear transducer 60, a full wafer disk shaped transducer 70 and a pie-shaped transducer 80 are shown. In each transducer 60, 70 and 80, the outline of the wafer 41 is shown and the chemical feed through 51 from FIG. 4 is shown.

The final rinse method is very important, since the final rinse needs to remove all of the suspended silica and/or polyphosphates from the surface. Also, when K-tripolyphosphate is being used, the final rinse needs to remove all of the K from the wafer. The final rinse method can be preferably carried out with megasonics with or without gas to avoid damage, high frequency to avoid damage. The final rinse can also be carried out with a atomized spray. The final rinse is preferably carried out with subambient temperature water.

In addition, the final rinse with subambient temperature water can be combined with a surface tension gradient particle removal and drying technique. Using an IPA (isopropyl alcohol) vapor of some sort usually generates the surface tension gradient. Examples of the surface tension gradient are described in U.S. Pat. Nos. 5,271,774; 5,571,337; 5,634,978 and 6,491,764. The subambient temperature water can be contacted to the front side of the wafer first, followed by a surface tension gradient cleaning and or drying. The subambient temperature DI water can also be applied together with the IPA vapor instead of the common room temperature DI water as shown in U.S. Pat. No. 6,491,764.

In view of this disclosure, a representative embodiment of the present invention is a method for cleaning a substrate that comprises the steps of contacting a surface of the substrate with a cleaning solution comprised of a polyphosphate; and then removing the cleaning solution from the surface. Generally, the substrate is an electronic substrate meaning that it is a semiconductor wafer or a storage medium, such as a hard disk, or a substrate used in manufacturing wafers or storage media, such as a photomask or an imprint mold. The method may be used to clean a single substrate or more than one substrate at a time. An additional optional step in the method is to apply acoustic energy to the cleaning solution while the cleaning solution is in contact with the surface. Another additional optional step in the method is to remove the cleaning solution from the surface by rinsing the surface with a rinsing solution with or without the application of acoustic energy to the rinsing solution while the surface is being rinsed. In this context acoustic energy means acoustic energy of any appropriate frequency, such as ultrasonic energy or megasonic energy.

Generally, the surface of the substrate has a plurality of particles adhered to it and at least some of the particles are carried away from the surface when the cleaning solution is removed from the surface, such as by rinsing. In a particularly useful application, the particles are submicron particles, meaning that the particles are smaller than one micrometer. In another particularly useful application, the surface of the substrate has at least one electronic feature having a dimension of less than 0.3 micrometers formed on it. Examples of such electronic features are the transistor gates or interconnect lines formed on the surface of a semiconductor wafer. Other examples include the patterns formed in imprint molds, which are the reverse image of the features on a semiconductor wafer, or the features formed on a photomask that are reduced in the photolithographic process.

Another embodiment of the present invention is a cleaning solution for cleaning substrates, including electronic substrates, and that can be used in the method described above. The cleaning solution comprises a polyphosphate, such as any of the water soluble polyphosphates. Depending on the application, the cleaning solution may also comprise a base, such as KOH, NH₄OH, TMAH or choline, and/or a quantity of suspended particles, such as colloidal silica, ceria and alumina. Complexing agents, amines, biocides, surfactants and/or other substances, may also be added to the cleaning solution. An especially useful embodiment of the cleaning solution comprises a tripolyphosphate, ammonium hydroxide, and optionally, a quantity of suspended particles.

The present invention is also useful for bevel edge cleaning. Indeed, the suspended silica and/or polyphosphate are very powerful at removing contamination from the bevel of the wafer. This is best carried out with an aggressive mechanical means that is selective to the bevel itself. The easiest mechanical assist that is selective to the bevel itself is a brush. If the brush material only contacts the wafer bevel edge and not the frontside of the wafer, then this method can remove the contamination from the bevel edge without damaging fragile structures on the frontside of the wafer. Another mechanical assist is a buffing cloth preferably made of polyurethane that contacts only the bevel edge of the wafer. Finally a last mechanical assist is a sonic energy that is confined to the edge of the wafer. The sonic energy will only cause damage when the energy is transferred to the liquid. Hence, the frontside of the wafer must be kept dry while applying this sonic energy to the bevel edge of the wafer. This can be done as shown in FIG. 6.

Figure 6:
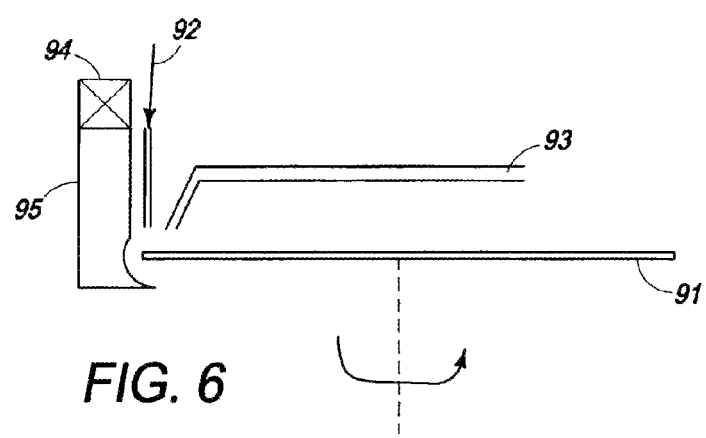
FIG. 6 is a schematic side view of a bevel edge cleaning apparatus according to the present invention.

Referring to FIG. 6, a wafer 91 is being rotated at a very low rpm, typically between 3 rpm and 100 rpm, and preferably between 3 rpm and 20 rpm, while a sonic (acoustic) transducer 95 is transferring sonic (acoustic) energy to the bevel edge of the wafer. The sonic transducer consists of a PZT crystal 94 and a member 95 to transfer the sonic vibrations to the bevel edge of the wafer. A cleaning solution, preferably containing suspended silica and/or polyphosphate is dispensed through nozzle 92 in the space between the member 95 and the bevel edge of the wafer 91. At the same time a vapor containing IPA is blown through a nozzle 93 in the front side of the wafer right next to the edge to keep the frontside of the wafer substantially dry so as not to damage any fragile structures on the frontside. The sonic frequency can be any frequency even including ultrasonic and/or megasonic frequency. The frequency can be from 20 kHz to 6000 kHz. Preferred frequencies are about 400 kHz.

Accordingly the present invention provides an improved solution, method and apparatus for removing particles from the surface and/or bevel of semiconductor wafers and hard disks, and from the surface of photomasks and imprint molds used in the manufacturing of such semiconductor wafers or hard disks. The present invention provides improved solutions at point-of-use and improved concentrated solutions that can be manufactured and pre-mixed off-site and then transported to the fab where they can be diluted at point-of-use with DI water.

The present invention also provides a method, apparatus and solution to remove particles from the front side of semiconductor wafers, photomasks and imprint molds without substantial underetching of particles and without substantial material loss from the surface of such substrates and without damage on the front-side of such substrates. The present invention also provides a solution, method and apparatus to avoid any deposition of scrubbing or cleaning particles added to the solution in order to achieve the cleaning action of adhered particles, and provides an improved method and apparatus for rinsing after cleaning. The present invention also provides an improved solution, method and apparatus for cleaning contamination from the bevel of a wafer or hard disk.

Although the present invention has been described in terms of the presently preferred embodiments, it is to be understood that such disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true scope of the invention.

What is claimed is:

1. A method for cleaning a hard disk substrate comprising:
   contacting a surface of a hard disk substrate with a cleaning solution comprised of a polyphosphate, water and a base, with the volume of the water in the cleaning solution being greater than 90.9% of the total volume of the cleaning solution, and the surface of the hard disk substrate having a plurality of submicron particles adhered to the surface; and
   removing the cleaning solution from the surface with at least some of the submicron particles being carried away from the surface when the cleaning solution is removed from the surface.

2. The method of claim 1 wherein the concentration of the polyphosphate is in the range of 0.2% to 15% by weight.

3. The method of claim 1 further comprising the steps of:
   obtaining a concentrated form of the cleaning solution in which the concentration of the polyphosphate is between 0.5% and 200% by weight in the concentrated form; and
   diluting the concentrated form of the cleaning solution before contacting the surface of the hard disk substrate with the cleaning solution.

4. The method of claim 1 wherein the polyphosphate is a tripolyphosphate.

5. The method of claim 1 wherein the polyphosphate has the formula

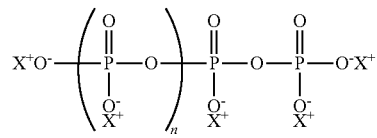

where n=0 to 1000.

6. The method of claim 1 further comprising the steps of:
   obtaining a concentrated form of the cleaning solution in which the base comprises either NH₄OH in a concentration of between 1%-28% (by weight of ammonia) or potassium hydroxide in a concentration of between 0.001%-45%; and
   diluting the concentrated form of the cleaning solution before contacting the surface of the hard disk substrate with the cleaning solution.

7. The method of claim 1 wherein the base is chosen from the group consisting of KOH, NH₄OH, TMAH and choline.

8. The method of claim 1 wherein the cleaning solution also comprises a plurality of suspended particles.

9. The method of claim 1 wherein the cleaning solution is removed from the surface by rinsing the surface with a rinsing solution with or without the application of acoustic energy to the rinsing solution while the surface is being rinsed.

10. The method of claim 9 wherein the rinsing solution comprises water.

11. The method of claim 1 further comprising:
applying acoustic energy to the cleaning solution while the cleaning solution is in contact with the surface.

12. A method for cleaning a hard disk substrate comprising:
obtaining a concentrated form of a cleaning solution comprised of a tripolyphosphate, water and a base in which the base comprises either $NH_4OH$ in a concentration of between 1%-28% (by weight of ammonia) or potassium hydroxide in a concentration of between 0.001%-45%;
diluting the concentrated form of the cleaning solution so that the volume of the water in the diluted cleaning solution is greater than 90.9% of the total volume of the diluted cleaning solution;
contacting a surface of a hard disk substrate having a plurality of submicron particles adhered to the surface with the diluted cleaning solution; and
removing the diluted cleaning solution from the surface with a rinsing solution with or without the application of acoustic energy to the rinsing solution while the surface is being rinsed, with at least some of the submicron particles being carried away from the surface when the diluted cleaning solution is removed from the surface with the rinsing solution.

13. The method of claim 12 wherein the concentration of the tripolyphosphate in the diluted cleaning solution is in the range of 0.2% to 15% by weight.

14. The method of claim 12 wherein the rinsing solution comprises water.

15. A method for cleaning a wafer comprising:
contacting a surface of a semiconductor wafer with a cleaning solution comprised of a polyphosphate, water and a base, with the volume of the water in the cleaning solution being greater than 90.9% of the total volume of the cleaning solution, and the surface of the semiconductor wafer having a plurality of submicron particles adhered to the surface; and
removing the cleaning solution from the surface of the semiconductor wafer with at least some of the submicron particles being carried away from the surface when the cleaning solution is removed from the surface.

16. The method of claim 15 wherein the concentration of the polyphosphate is in the range of 0.2% to 15% by weight.

17. The method of claim 15 wherein the polyphosphate is a tripolyphosphate.

18. The method of claim 15 wherein the polyphosphate has the formula

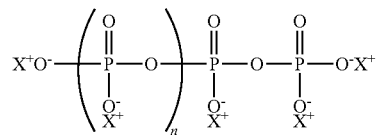

where n=0 to 1000.

19. The method of claim 15 wherein the base is chosen from the group consisting of KOH, $NH_4OH$, TMAH and choline.